US008008216B2

United States Patent
Alshareef et al.

(10) Patent No.: US 8,008,216 B2
(45) Date of Patent: Aug. 30, 2011

(54) NITROGEN PROFILE IN HIGH-K DIELECTRICS USING ULTRATHIN DISPOSABLE CAPPING LAYERS

(75) Inventors: Husam Alshareef, Plano, TX (US); Manuel Quevedo Lopez, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 536 days.

(21) Appl. No.: 11/860,066

(22) Filed: Sep. 24, 2007

(65) Prior Publication Data

US 2009/0104743 A1 Apr. 23, 2009

(51) Int. Cl.
*H01L 21/31* (2006.01)
*H01L 21/469* (2006.01)
(52) U.S. Cl. ........ 438/775; 257/346; 257/E29.151; 438/149; 438/151; 438/364; 438/777; 438/791
(58) Field of Classification Search .......... 438/775–777, 438/791, 792; 257/E21.302
See application file for complete search history.

(56) References Cited

U.S. PATENT DOCUMENTS

| 6,245,626 | B1 | 6/2001 | Chen et al. |
| 6,649,543 | B1 | 11/2003 | Moore |
| 7,138,308 | B2 | 11/2006 | Cheng et al. |
| 7,229,873 | B2 | 6/2007 | Colombo et al. |
| 7,445,984 | B2 * | 11/2008 | Rao et al. ............... 438/211 |
| 2007/0052034 | A1 * | 3/2007 | Yu et al. ................. 257/365 |
| 2008/0153241 | A1 * | 6/2008 | Hsu et al. ................ 438/305 |
| 2008/0237743 | A1 * | 10/2008 | Ramin et al. ............ 257/407 |

OTHER PUBLICATIONS

PCT Notification of Transmittal of the International Search Report and the Written Opinion of the International Searching Authority, or the Declaration, and the Written Opinion of the International Searching Authority, dated Mar. 23, 2009, Authorized Officer Keun Yong Park.

\* cited by examiner

*Primary Examiner* — Fernando L Toledo
(74) *Attorney, Agent, or Firm* — Warren L. Franz; Wade J. Brady, III; Frederick J. Telecky, Jr.

(57) ABSTRACT

Metal Oxide Semiconductor (MOS) transistors fabricated using current art may utilize a nitridation process on the gate dielectric to improve transistor reliability. Nitridation by the current art, which involves exposing the gate dielectric to a nitridation source, produces a significant concentration of nitrogen at the interface of the gate dielectric and the transistor substrate, which adversely affects transistor performance. This invention comprises the process of depositing a sacrificial layer on the gate dielectric prior to nitridation, exposing the sacrificial layer to a nitridation source, during which time nitrogen atoms diffuse through the sacrificial layer into the gate dielectric, then removing the sacrificial layer without degrading the gate dielectric. Work associated with this invention on high-k gate dielectrics has demonstrated a 20 percent reduction in nitrogen concentration at the gate dielectric—transistor substrate interface.

12 Claims, 4 Drawing Sheets

NITROGEN PROFILE IN HIGH-K DIELECTRICS USING ULTRATHIN DISPOSABLE CAPPING LAYERS

FIELD OF THE INVENTION

This invention relates to the field of integrated circuits. More particularly, this invention relates to fabricating metal oxide semiconductor transistors in integrated circuits.

BACKGROUND OF THE INVENTION

It is well known that the sizes of transistors in integrated circuits (ICs) have been getting smaller as microelectronic fabrication technology progresses over time. In particular, metal oxide semiconductor (MOS) transistor dimensions are on a recognized shrinkage trend. One of the features of MOS transistors that is part of this trend is the thickness of the gate dielectric which insulates the gate from the transistor substrate. As the thickness of the gate dielectric has been reduced, there has been a need to improve the reliability of the gate dielectric with respect to the applied electric potential across the gate dielectric. The current art diffuses nitrogen into the gate dielectric to meet this need. This is accomplished by exposing the gate dielectric to a nitrogen containing plasma, before the gate material is deposited. A disadvantage of this process is that some nitrogen ends up at the interface between the gate dielectric and the transistor substrate, and some nitrogen diffuses into the transistor substrate, causing reduced carrier mobility in the transistor substrate and other adverse effects. Attempted solutions to this problem have focused on reducing the electrical power in the nitrogen plasma. Reducing the power to the nitrogen plasma has resulted in less control over the total amount of nitrogen in the gate dielectric as well as less control over the distribution of nitrogen in the body of the gate dielectric.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

This invention comprises a process sequence of forming a sacrificial layer of material, preferably between 5 and 150 Angstroms thick, on the top surface of the gate dielectric before the gate dielectric is exposed to a nitridation source, exposing the sacrificial layer to a nitridation source, typically a nitrogen plasma, and removing the sacrificial layer.

DETAILED DESCRIPTION

Figure 1:
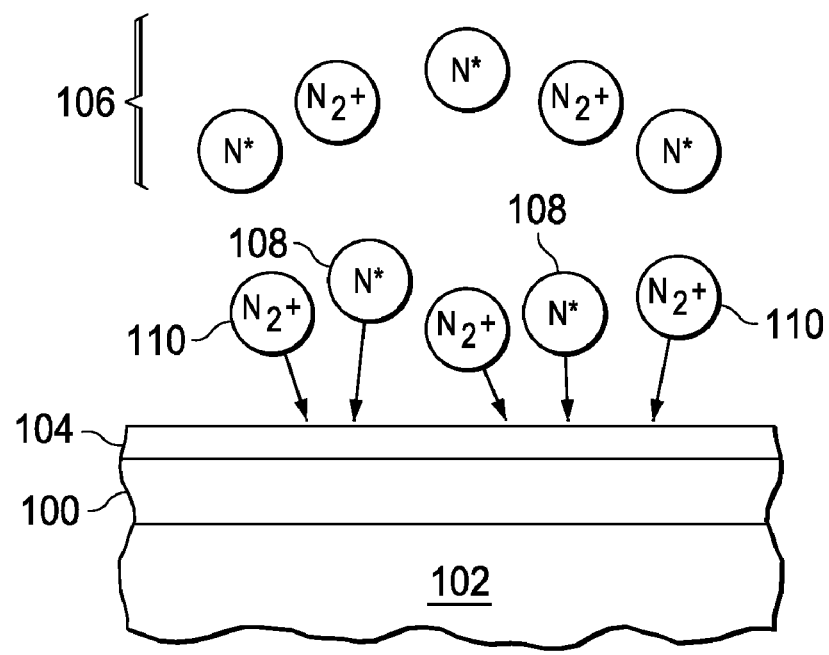
FIG. 1 is a cross-section of a gate dielectric fabricated according to an embodiment of the instant invention during exposure to a nitridation source.

FIG. 1 is a cross-section of a gate dielectric and sacrificial layer fabricated according to an embodiment of the instant invention during exposure to a nitridation source. Gate dielectric (100), which may be comprised of silicon dioxide, hafnium oxide, or other dielectric material, is formed on a top surface of a transistor substrate (102). A sacrificial layer (104) is deposited on a top surface of the gate dielectric. The sacrificial layer (104) is between 5 and 150 Angstroms in thickness. Material for the sacrificial layer (104) is selected to be permeable to nitrogen atoms under nitridation process conditions, and to be easily removed from the gate dielectric without adversely affecting the gate dielectric or degrading transistor performance, for example aluminum oxide or aluminum nitride. The sacrificial layer is exposed to a nitridation source (106), typically a nitrogen plasma operated at 50 to 200 Watts RF power, with a nitrogen gas flow between 1 to 1000 sccm (standard cubic centimeters per minute), at a pressure from 1 millitorr to 1200 millitorr. Nitrogen, possibly in the form of electronically excited nitrogen (108) and ionized nitrogen (110), emerges from the nitridation source (106) and diffuses to the sacrifical layer (104). During exposure of the sacrificial layer (104) to the nitridation source (106), nitrogen is absorbed by the sacrificial layer (104) and diffuses through the sacrificial layer (104) into the gate dielectric (100).

Figure 2:
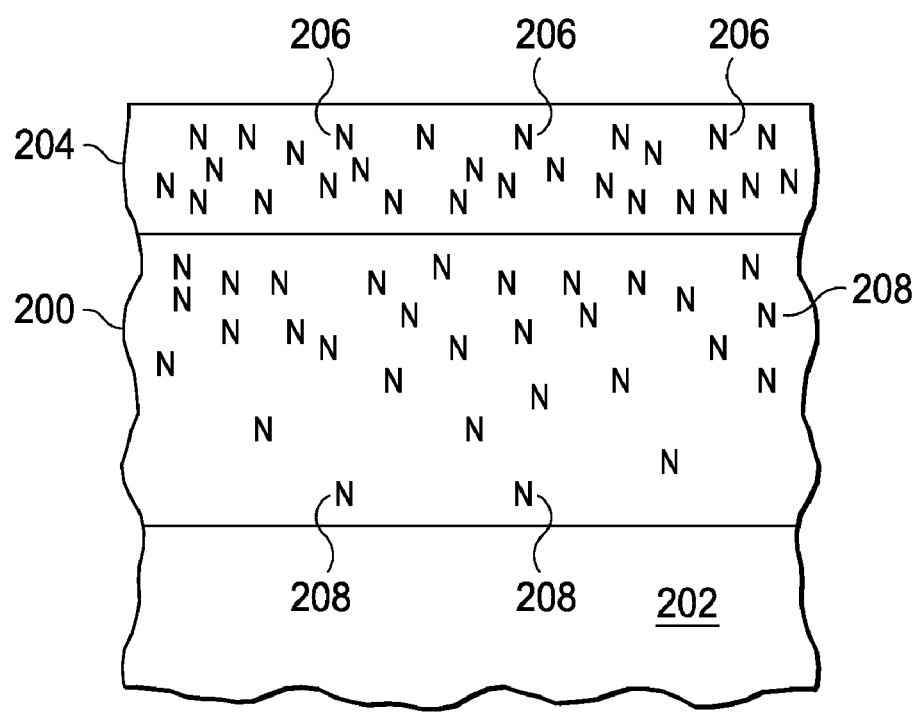
FIG. 2 is a cross-section of a gate dielectric fabricated according to an embodiment of the instant invention after exposure to a nitridation source.

FIG. 2 is a cross-section of a gate dielectric and sacrificial layer fabricated according to an embodiment of the instant invention after exposure to a nitridation source. Gate dielectric (200), transistor substrate (202) and sacrificial layer (204) are as described above in reference to FIG. 1. Nitrogen atoms (206) are distributed throughout the sacrificial layer. Other nitrogen atoms (208) are distributed in the gate dielectric (200) in a manner that a concentration of nitrogen atoms (208) at an interface of the gate dielectric (200) and the transistor substrate (202) is less than that produced by an equivalent nitridation process on a gate dielectric without the benefit of this invention, while the total number of nitrogen atoms (208) in the gate dielectric (200), expressed in atoms per unit area, is the same as that produced by an equivalent nitridation process on a gate dielectric without the benefit of this invention. This is advantageous because transistors fabricated using this invention exhibit expected benefits from nitridation, and have improved performance in parameters affected by the concentration of nitrogen at the gate dielectric—transistor substrate interface.

Figure 3:
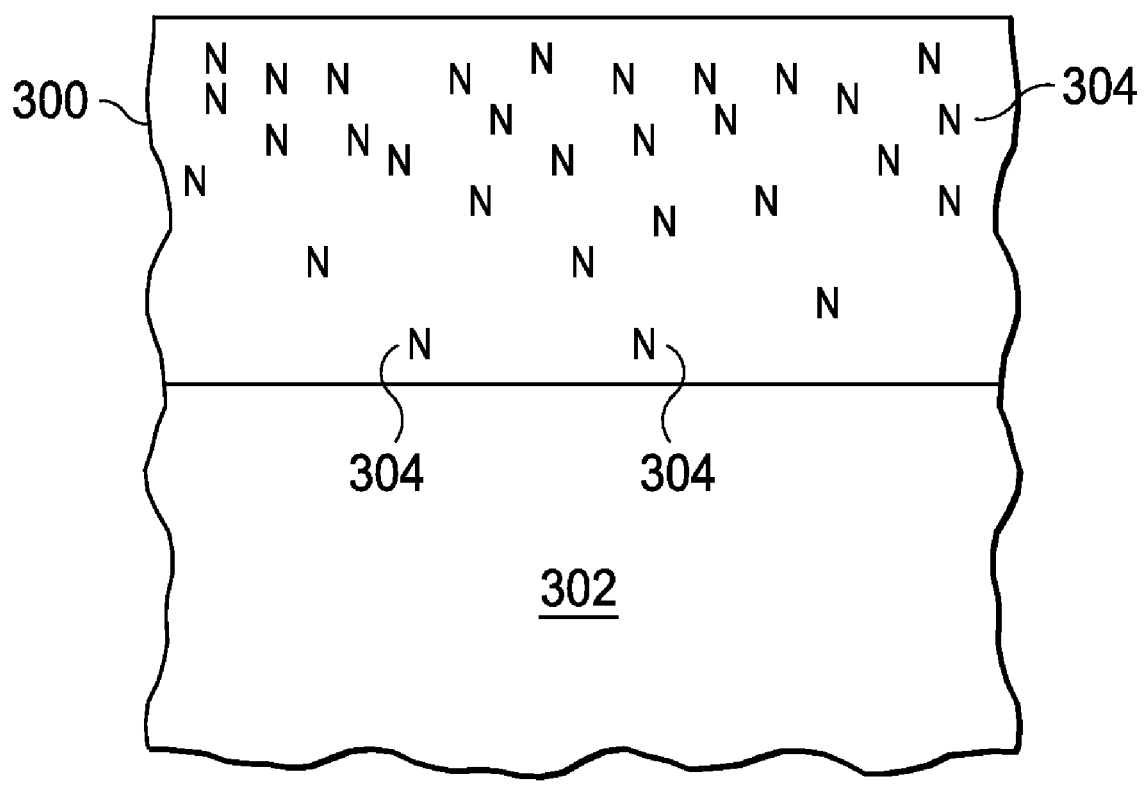
FIG. 3 is a cross-section of a gate dielectric fabricated according to an embodiment of the instant invention after exposure to a nitridation source and removal of the sacrificial layer.

FIG. 3 is a cross-section of a gate dielectric and sacrificial layer fabricated according to an embodiment of the instant invention after the sacrificial layer has been removed. Gate dielectric (300) and substrate (302) are as described above in reference to FIG. 2. The sacrificial layer depicted in FIG. 2 has been removed in a manner that did not degrade gate dielectric (300). Nitrogen atoms (304) are distributed throughout the sacrificial layer in an advantageous manner, as described above.

Figure 4A:
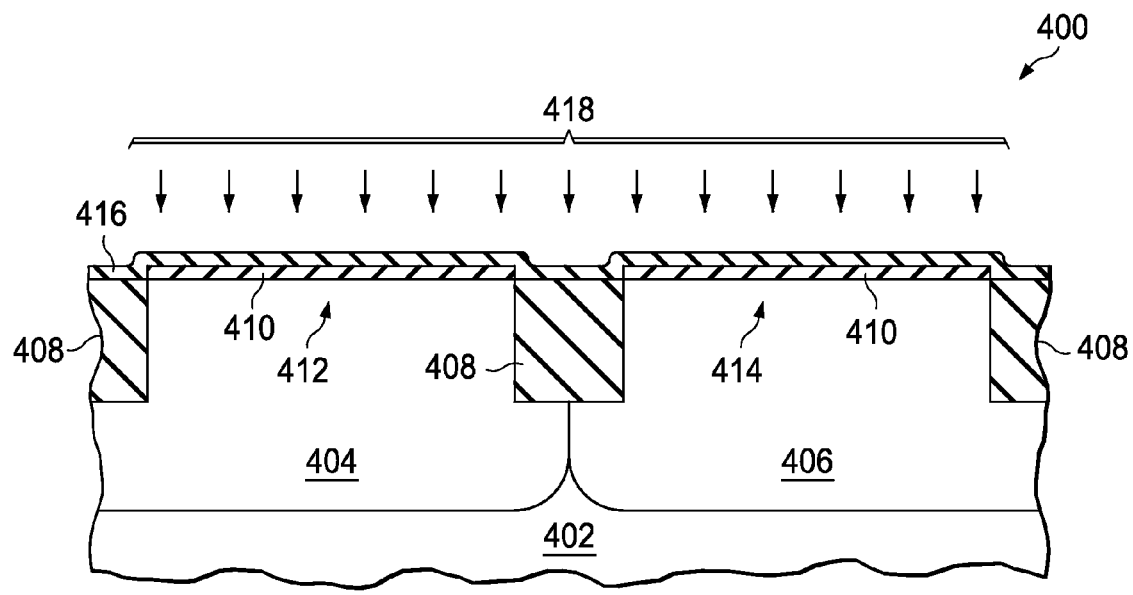
FIG. 4A is a cross-section of an integrated circuit containing MOS transistors with gate dielectrics fabricated according to an embodiment of the instant invention during exposure to a nitridation source.

FIG. 4A is a cross-section of an integrated circuit containing MOS transistors with gate dielectrics fabricated according to an embodiment of the instant invention during exposure to a nitridation source. Integrated circuit (400) comprises a substrate (402), typically comprised of p-type silicon. A p-type region known as a p-well (404) and an n-type region known as an n-well (406) are formed in said substrate (402), typically by ion implantation. Field oxide (408), typically composed of silicon dioxide, is formed to isolate components in the integrated circuit, typically by local oxidation of silicon (LOCOS) or shallow trench isolation (STI). A gate dielectric (410) is formed on a top surface of, and in contact with, an active region (412) in the p-well and an active region (414) in the n-well. A sacrificial layer (416) is formed in accordance with an embodiment of the instant invention on a top surface of, and in contact with, the gate dielectric (410). The sacrificial layer (416) is exposed to a nitridation source (418), typically a nitrogen plasma.

Figure 4B:
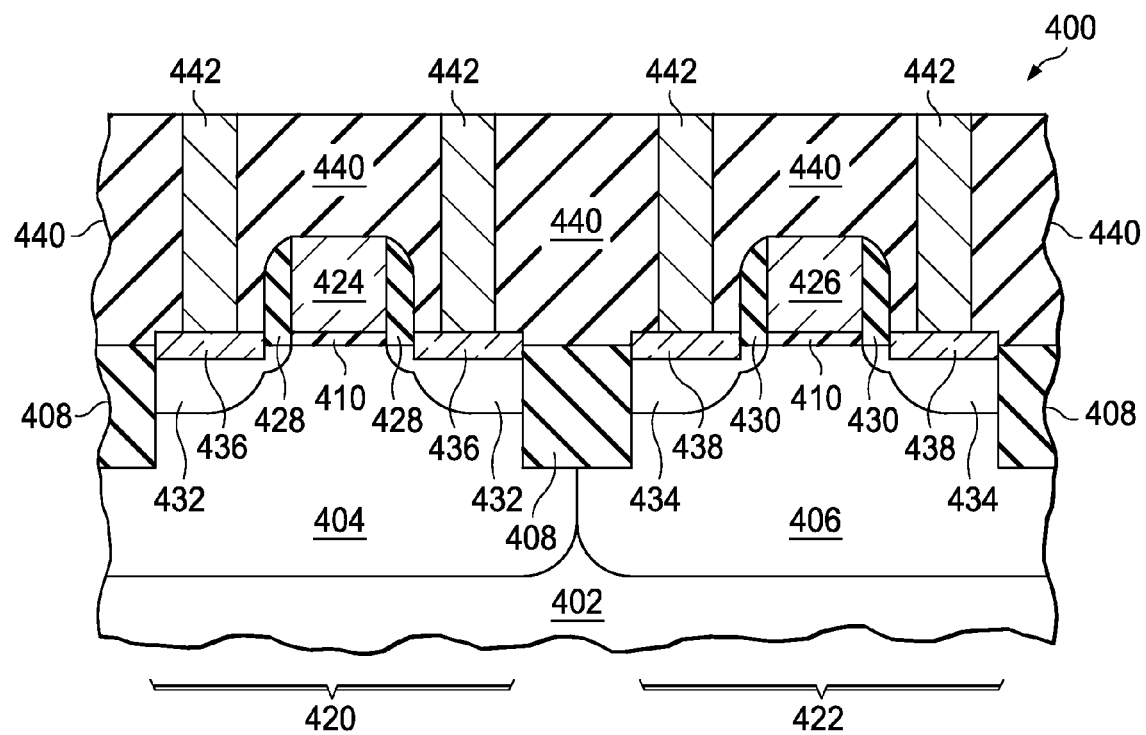
FIG. 4B is a cross-section of an integrated circuit containing MOS transistors with gate dielectrics fabricated according to an embodiment of the instant invention after fabrication of an n-channel and a p-channel MOS transistor.

FIG. 4B is a cross-section of the integrated circuit containing MOS transistors with gate dielectrics fabricated according to an embodiment of the instant invention after transistor fabrication is completed and contacts are formed to the transistors. An n-channel MOS transistor (420) and a p-channel MOS transistor (422) are formed by depositing a gate material, typically polycrystalline silicon, on the gate dielectric (410) formed in accordance with an embodiment of this invention, forming a photoresist pattern to define gate regions, and etching said gate material to form n-channel and p-channel gate structures (424, 426), forming optional n-channel and p-channel gate sidewall spacers (428, 430), typically by conformal deposition of layers of silicon nitride and silicon dioxide followed by anisotropic etchback, forming n-type source and drain regions (432) in the n-channel MOS transistor and p-type source and drain regions (434) in the p-channel MOS transistor, typically by ion implantation, and forming optional metal silicide regions (436) on surfaces of said n-channel source and drain regions (432) and optional metal silicide regions (438) on surfaces of said p-channel source and drain regions (434). A layer or layers of dielectric (440) known a pre-metal dielectric (PMD), typically comprised of layers of silicon nitride and silicon dioxide, are deposited on, and in contact with, a top surface of integrated circuit (400). Vertical metal vias known as contacts (442) are formed in the PMD by etching contact holes and filling with contact metal, typically tungsten, making electrical contact with the source and drain regions (432, 434).

Figure 5:
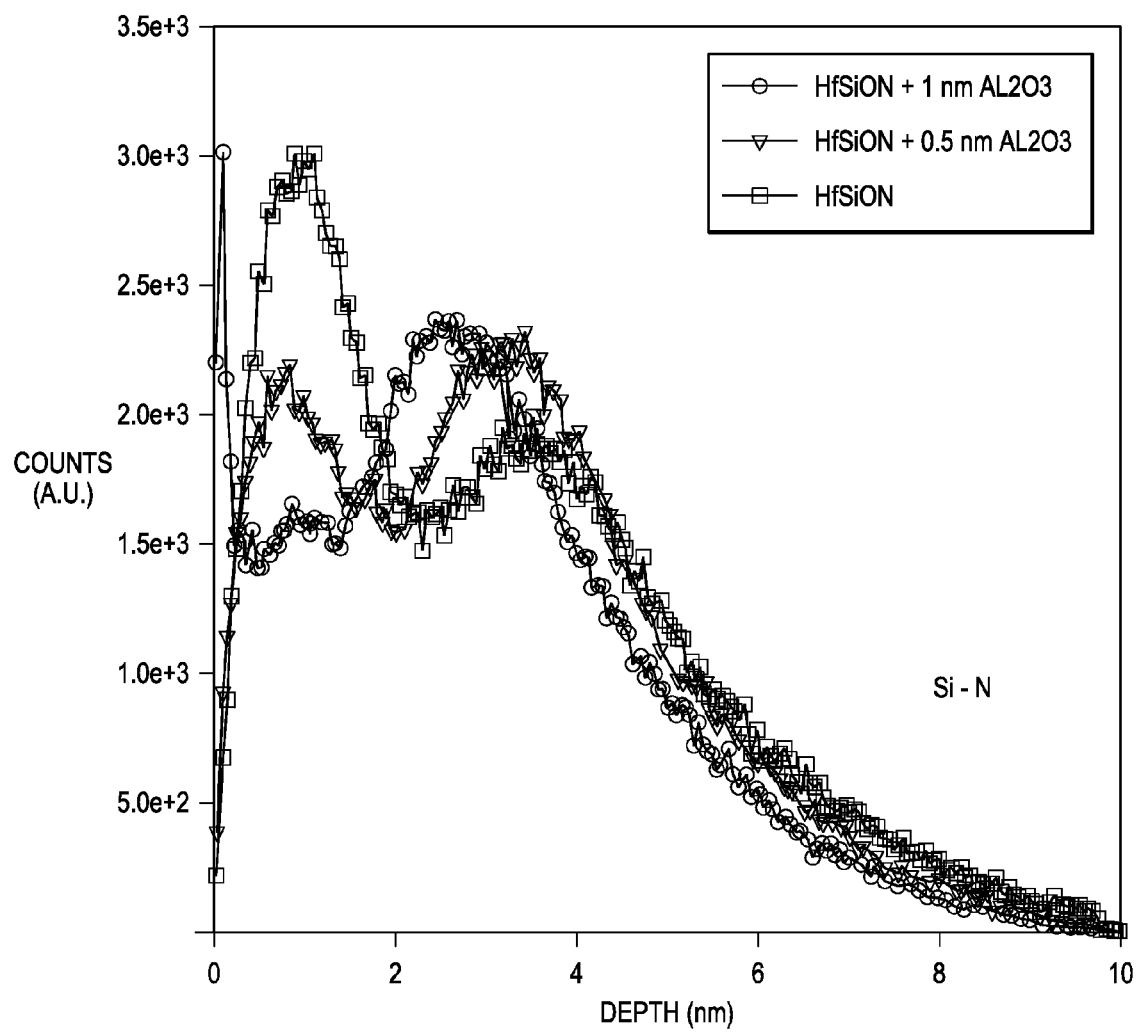
FIG. 5 is a chart of nitrogen profiles in a gate dielectric fabricated using the current art and a gate dielectric fabricated according to an embodiment of the instant this invention.

FIG. 5 is a chart of the nitrogen concentrations as a function of depth in a gate dielectric fabricated according to an embodiment of the instant the current art and a gate dielectric fabricated per this invention. It may be seen in FIG. 5 that the use of a sacrificial layer comprised of a 10 Angstroms thick film of aluminum oxide reduces the concentration of nitrogen at the interface between the gate dielectric and the transistor substrate by approximately 20 percent compared to the current art.

What is claimed is:

1. A method of fabricating an integrated circuit, comprising the steps of:
    providing a substrate;
    forming field oxide in said substrate;
    forming an n-well in said substrate;
    forming a p-well in said substrate;
    forming a gate dielectric layer on a top surface of said p-well;
    forming a sacrificial layer of material on a top surface of said gate dielectric layer;
    exposing said sacrificial layer to a nitridation source;
    removing said sacrificial layer;
    forming an n-channel MOS transistor in said p-well by a process comprising the steps of:
        forming a first gate structure on a top surface of said gate dielectric;
        forming n-type lightly doped source and drain regions in said p-well adjacent to said first gate structure;
        forming a first set of gate sidewall spacers abutting lateral surfaces of said first gate structure;
        forming n-type source and drain regions in said p-well adjacent to said first gate structure and contacting said n-type lightly doped source and drain regions; and
        forming a first set of silicide regions on, and in contact with, top surfaces of said n-type source and drain regions and said first gate structure;
    forming a p-channel MOS transistor in said n-well by a process comprising the steps of:
        forming a second gate structure on a top surface of said gate dielectric layer;
        forming p-type lightly doped source and drain regions in said n-well adjacent to said second gate structure;
        forming a second set of gate sidewall spacers abutting lateral surfaces of said second gate structure;
        forming p-type source and drain regions in said n-well adjacent to said second gate structure and contacting said p-type lightly doped source and drain regions; and
        forming a second set of silicide regions on, and in contact with, top surfaces of said p-type source and drain regions and said second gate structure;
    forming a pre-metal dielectric layer stack on said n-channel transistor and said p-channel transistor;
    forming contacts in said pre-metal dielectric layer stack on said n-type source and drain regions, said p-type source and drain regions, said first gate structure and said second gate structure;
    forming a first intra-level dielectric layer on said contact; and
    forming metal interconnect structures whereby the metal interconnect structures connect to and overlap said contacts.

2. The method of claim 1 wherein said sacrificial layer is between 5 and 150 Angstroms thick.

3. The method of claim 1 wherein said sacrificial layer is composed of aluminum oxide.

4. The method of claim 1 wherein said sacrificial layer is composed of aluminum nitride.

5. The method of claim 1 wherein said gate dielectric is comprised of silicon dioxide.

6. The method of claim 5 wherein said silicon dioxide is thermally grown.

7. The method of claim 1 wherein said gate dielectric is comprised of hafnium dioxide.

8. The method of claim 1 wherein said nitridation source is a nitrogen plasma.

9. The method of claim 8 wherein said nitrogen plasma is operated at:
    RF power between 50 and 200 Watts;
    a nitrogen gas flow between 1 to 1000 sccm (standard cubic centimeters per minute); and
    a pressure between 1 millitorr and 1200 millitorr.

10. A method of fabricating an integrated circuit, comprising:
    forming a gate dielectric layer over a semiconductor substrate;
    depositing a nitrogen permeable sacrificial layer of 5 to 150 angstroms thickness over the gate dielectric layer;

exposing the sacrificial layer to a nitridation source comprising a nitrogen plasma, whereby nitrogen is absorbed by the sacrificial layer and diffused into the gate dielectric layer;

after exposing the sacrificial layer to the nitridation source, removing the sacrificial layer from over the gate dielectric layer; and depositing a gate electrode material over the over the gate dielectric layer.

11. The method of claim 10 wherein the gate dielectric layer comprises hafnium oxide; and the sacrificial layer comprises aluminum oxide or aluminum nitride.

12. A method of fabricating an integrated circuit, comprising:

forming a HfSiON gate dielectric layer over a semiconductor substrate;

forming an $Al_2O_3$ sacrificial layer of 5-10 angstroms thickness over the gate dielectric layer;

exposing the sacrificial layer to a plasma nitrogen ion source, whereby nitrogen is absorbed by the sacrificial layer and diffused into the gate dielectric layer for nitridation of the gate electrode;

after exposing the sacrificial layer to the nitridation source, removing the sacrificial layer from over the gate dielectric layer; and depositing a gate electrode material over the over the gate dielectric layer.

* * * * *